United States Patent [19]

Heinonen et al.

[11] Patent Number: 5,530,923
[45] Date of Patent: Jun. 25, 1996

[54] DUAL MODE TRANSMISSION SYSTEM WITH SWITCHED LINEAR AMPLIFIER

[75] Inventors: Jarmo Heinonen, Salo; Jaakko Hulkko, Oulu; Toivo Vilmi, Haukipudas, all of Finland

[73] Assignee: Nokia Mobile Phones Ltd., Salo, Finland

[21] Appl. No.: 219,772

[22] Filed: Mar. 30, 1994

[51] Int. Cl.$^6$ ........................................... H04B 1/04
[52] U.S. Cl. ........................... 455/126; 455/93; 455/127; 330/51; 330/295
[58] Field of Search ............... 455/93, 115, 116, 455/126, 127, 89, 129, 95, 102, 103; 375/5, 295, 297; 330/51, 284, 144, 145, 295

[56] References Cited

U.S. PATENT DOCUMENTS

| | | | |
|---|---|---|---|
| 4,034,308 | 7/1977 | Wermuth et al. | 330/86 |
| 4,257,009 | 3/1981 | Yorkanis | 330/51 |
| 4,446,440 | 5/1984 | Bell | 330/10 |
| 4,924,191 | 5/1990 | Erb et al. | 330/130 |
| 4,955,083 | 9/1990 | Phillips et al. | 455/47 |
| 5,060,294 | 10/1991 | Schwent et al. | 455/93 |
| 5,121,081 | 6/1992 | Hori | 330/279 |
| 5,175,871 | 12/1992 | Kunkel | 455/93 |
| 5,179,353 | 1/1993 | Miyake | 455/126 |
| 5,276,917 | 1/1994 | Vanhanen et al. | 455/127 |
| 5,307,512 | 4/1994 | Mitzlaff | 455/127 |
| 5,392,463 | 2/1995 | Yamada | 455/93 |
| 5,432,473 | 7/1995 | Mattila et al. | 455/127 |
| 5,438,684 | 8/1995 | Schwent et al. | 455/127 |

FOREIGN PATENT DOCUMENTS 90302627 10/1990 European Pat. Off.
54-104760 8/1979 Japan.

*Primary Examiner*—Reinhard J. Eisenzopf
*Assistant Examiner*—Nguyen Vo
*Attorney, Agent, or Firm*—Perman & Green

[57] ABSTRACT

A dual mode transmitter circuit is disclosed including a non-linear high-power amplifier having an amplification that can be adjusted and a linear high-power amplifier. A first switch and a second switch are connected to the input and output of the linear, high-power amplifier. An amplification-adjustable, high-frequency transmitter control amplifier is connected to the input of the non-linear high-power amplifier. Apparatus for measuring transmission power such as a directional coupler is connected to the second switch, and a duplex filter is connected to the directional coupler. A power level control circuit is responsive to the measured transmission power from the directional coupler and to a power level signal. The power level signal is representative of the desired output power of the transmitter. The power level control circuit compares the measured power level from the directional coupler with the desired power level and produces a difference signal on its output lead which is connected to both the non-linear high-power amplifier and to the high-frequency transmitter control amplifier. A mode selection signal, for designating either an analog or digital type transmission mode is applied to a mode control circuit that is responsive to the mode selection signal and provides switching signals to the first and second switches and a control signal to the linear amplifier. The mode selection signal sets the transmitter to function in either the non-linear transmission (analog) mode or the linear transmission (digital) mode.

2 Claims, 1 Drawing Sheet

DUAL MODE TRANSMISSION SYSTEM WITH SWITCHED LINEAR AMPLIFIER

BACKGROUND OF THE INVENTION

1. Field of the Invention

The present invention relates to dual mode radio frequency transmitters, and more particularly to a dual mode transmitter having a to-and-from transmission path including a switched linear amplifier responsive to a mode-of-operation control signal.

2. Description of the Background Art

U.S. Pat. No. 5,121,081 issued Jan. 9, 1992 to Hori entitled "OUTPUT WAVEFORM CONTROL CIRCUIT" discloses an output waveform control circuit for a time division multiple access system, including a second driving circuit which sends a control signal to the power amplifier in accordance with a signal outputted by the comparator circuit. Thus, by controlling the operating voltage of the power amplifier simultaneously with the control of the level input signal from the input level control circuit, the output characteristic of the power amplifier, including a class C or the like amplifier having a non-linear input/output characteristic, is prevented from varying abruptly, and the output waveform of the power amplifier is so controlled as to have gently sloped leading and trailing edges.

U.S. Pat. No. 5,060,294 issued Oct. 22, 1991 to Schwent et al. entitled "DUAL MODE POWER AMPLIFIER FOR RADIOTELEPHONE" discloses a dual mode power amplifier operable in either the linear mode or the saturation mode. The power amplifier, when comprising a portion of a radio transmitter, permits efficient amplification of either a frequency modulated or a composite modulated signal by operation of the amplifier in the saturation mode or the linear mode, respectively. A processor determines the modulation-type of the signal and generates a signal to cause operation of the amplifier in either the saturation mode or the linear mode.

U.S. Pat. No. 4,955,083 issued Sep. 4, 1990 to Phillips et al. entitled "DUAL MODE RADIO TRANSCEIVER FOR AN SSB COMMUNICATION SYSTEM" discloses a radio transceiver for use in an SSB communication system having FM data capability. The dual-mode radio transceiver of the present invention includes a receiver capable of demodulating and deriving AFC from either the voice channel having voice messages transmitted via single sideband amplitude modulation with a pilot carrier, or the data channel having high speed data messages transmitted via narrowband frequency modulation in the same channel bandwidth. Furthermore, the dual-mode radio transceiver includes a transmitter capable of transmitting one of either of the above types of modulation on the appropriate channel, as determined by information received from the high speed data messages transmitted on the control channel.

U.S. Pat. No. 4,924,191 issued May 8, 1990 to Erb et al. entitled "AMPLIFIER HAVING DIGITAL BIAS CONTROL APPARATUS" discloses an amplifier equipped with a digital bias control apparatus to provide precise, dynamic control over the operating point of a plurality of amplifying elements in the amplifier. A processor optimizes the operating point of each individual amplifying element as a function of the amplifying element characteristics, the operating environment and the applied input signal. The use of a processor also enables the user to remotely program the operating point of each individual amplifying element in the amplifier. The processor further enables dynamic changes in the operating characteristics of the amplifier as the operating environment of these amplifying elements changes. The processor also generates an alarm signal if any particular amplifying element is operating out of its nominal specifications. This digital bias control apparatus can function in class A, AB, B or C type of amplifiers whether they are tuned or untuned and whether the amplifier operates in a pulsed or continuous mode.

U.S. Pat. No. 4,446,440 issued May 1, 1984 to Bell entitled "DUAL MODE AMPLIFIER" discloses an apparatus that amplifies the signal in a linear mode when the voltage of the signal is much less than the voltage of the power source, and in a switching mode when the signal is at other voltages.

U.S. Pat. No. 4,257,009 issued Mar. 17, 1981 to Yorkanis entitled "INHIBIT CIRCUIT FOR DIFFERENTIAL AMPLIFIER" discloses a system wherein the outputs of a pair of non-additive combiners are coupled to respective inputs of a differential amplifier and an a.c. signal to be amplified is applied to a selected input of one of the combiners. A control circuit operates in a first mode to apply control voltages to the combiner inputs for causing the one combiner to block the a.c. signal and also causing both combiners to apply a common mode input voltage of a first value to the amplifier inputs. In a second mode, the control circuit changes the values of the control voltages in a sense to cause the one combiner to pass the a.c. signal and to also cause both combiners to apply a common mode input voltage of a second value to the amplifier inputs whereby, in either mode, the amplifier produces a constant quiescent d.c. output voltage.

U.S. Pat. No. 4,034,308 issued Jul. 5, 1977 to Wermuth et al. entitled "AMPLIFIER WITH CONTROLLABLE TRANSMISSION FACTOR AND SWITCHABLE CONTROL CHARACTERISTIC" discloses an amplifier circuit whose gain bears a desired relation to a control voltage, including a differential amplifier, a plurality of impedances interconnected between the amplifier terminals and switches interconnected with the impedances and switchable between two states which create two impedance configurations that give the circuit mutually complementary gain vs. control voltage control characteristics..

Japanese Patent 54-104760 issued Aug. 17, 1979 to Hikari Honda entitled "AMPLIFIER OF LOW POWER CONSUMPTION" discloses a system a bias control signal circuit for an amplifier to provide lower power consumption. The output power is detected and a bias control signal is produced that changes the operation point of the amplifier depending on the transmission signal level.

European Patent Application No. 90302627.6 filed Mar. 13,, 1990 by Vaisanen and published Oct. 3, 1990, entitled "A METHOD FOR CHANGING THE OPERATING CLASS OF A TRANSMITTER" discloses a method for changing the operating class of a radio telephone transmitter used especially in a gsm radio telephone system. When the transmitter comprises one or several power stages of class A, B, AB or C, it is possible according to the invention to change the operating point of one or several power stage transistors by means of a controlled semiconductor switch whereby the class of the power stage amplifier changes to that desired.

SUMMARY OF THE INVENTION

It is difficult to provide a radio frequency transmitter for use in mobile phone systems for broadcasting both equal and non-equal amplitude high-frequency signals by means of the same device (e.g. the DAMPS and CDMA transmission systems to be referred to here as dual mode mobile phone systems) which will achieve highest possible efficiency in both operational modes. This is an especially serious problem in the case of hand-held phones, which require a high-efficiency transmitter in all modes of operation in order to provide a long operating time and to minimize warming caused by waste heat.

The conventional solution of employing a linear transmitter in which the same transmitter is used to amplify both equal and non-equal amplitude signals, results in poor efficiency, particularly in the case of transmissions which use equal amplitude signals.

One solution previously used in the art for dual mode transmission to improve efficiency is to provide a circuit in which the operating point of the transmitter (and thereby its efficiency) is adjusted in accordance with the signal to be transmitted. In the case of the amplification of an equal amplitude signal, the operational category is adjusted to class C, for example, which provides a high efficiency.

An object of the present invention is to provide a dual mode transmitter for use in mobile phone systems which produces a high efficiency in the case of both equal and non-equal amplitude transmissions.

BRIEF DESCRIPTION OF THE DRAWING

The drawing illustrates a schematic block diagram of an embodiment of a dual mode transmitter according to the principles of the present invention.

DESCRIPTION OF A PREFERRED EMBODIMENT

Figure 1:
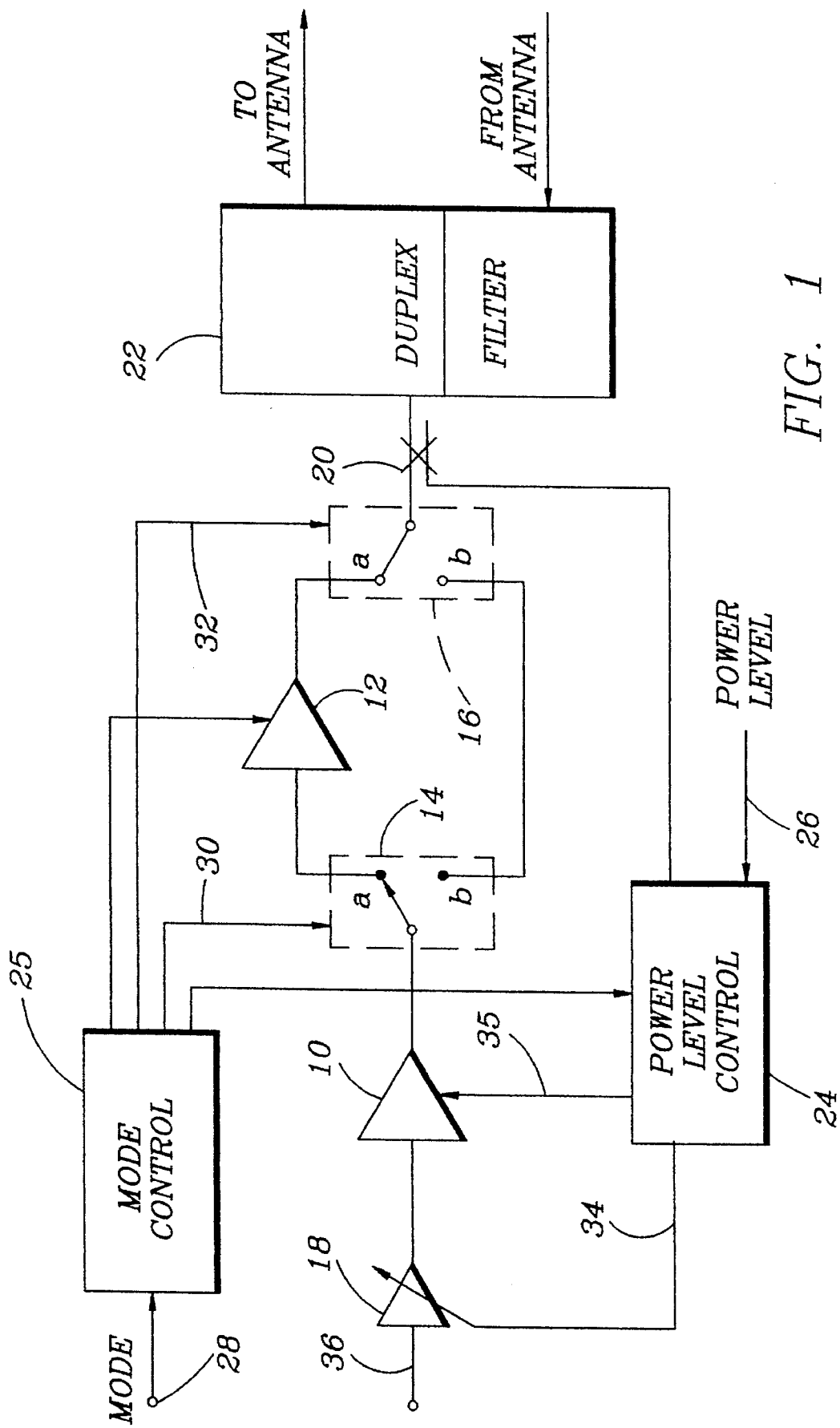

Referring to the drawing, a dual mode transmitter circuit is illustrated including a high-power amplifier means 10 having an amplification that can be adjusted and a linear high-power amplifier 12. A first switch 14 and a second switch 16 are connected to the input and output of amplifier 12. An amplification-adjustable, high-frequency transmitter control amplifier 18 is connected to the input of amplifier 10. Means 20 for measuring transmission power such as a directional coupler is connected to switch 16, and a duplex filter 22 is connected to means 20.

A power level control means 24 is responsive to the measured transmission power from means 20 and to a power level signal on lead 26. Power level signal on lead 26 is representative of the desired output power of the transmitter. The power level control means 24 compares the measured power level from means 20 with the desired power level on lead 26 and produces a difference signal on its output leads 34 and 35 and provides the difference signal on leads 34 and 35 to both the high-power amplifier 10 and to the high-frequency transmitter control amplifier 18.

The output of high power amplifier 10 can be controlled via the power amplification operating point, the operating voltage or the input operating power.

A mode selection signal, for designating either an analog or digital type transmission mode is applied to terminal 28. A mode control means 25 is responsive to the mode selection signal on terminal 28 and provides switching signals to switches 14 and 16 and a control signal to linear amplifier 12. Thus, the mode selection signal applied to terminal 28 sets the transmitter to function in either the non-linear transmission (analog) mode or the linear transmission (digital) mode.

The modulated signal to be transmitted is applied to the input terminal 36 of control amplifier 18, and passed through high-power amplifier 10. If switches 14 and 16 are set in the "a" position, which is the position for the digital transmission mode, the modulated signal from amplifier 10 is connected to and passes through linear high-power amplifier 12, through power measurement means (differential coupler) 20 and through duplex filter 22 where it is connected to an antenna (not shown) for transmission.

For the non-linear, or analog mode of transmission, an analog mode designating control signal is applied to terminal 28. In response, mode control means 25 provides signals on leads 30 and 32 which set switches 14 and 16 to the "b" position, thereby disconnecting and removing linear, high-power amplifier 12 from the transmission path between amplifier 10 and duplex filter 22. The output of amplifier 10 is connected through coupler 20 to filter 22. Amplifier 12 is in a non-active state. Amplifier 10 is operated near or at it's saturation non-linear region to achieve high enough output power and high efficiency.

The output power of the transmitter is controlled by adjusting either the amplifier 10 input power or the operating voltage of an output transistor contained in amplifier 10.

For the linear, or digital mode of transmission, the mode control signal at terminal 28 designates a digital transmission mode and causes mode control means 25 to provide signals on leads 30 and 32 to place switches 14 and 16 in the "a" position wherein the output of amplifier 10 is connected to the input of linear amplifier 12. The overall output power from amplifier 18 and amplifier 10 has been set so low, that amplifiers 18 and 10 effectively operate in a linear manner, for example with a -6 dB backoff, meaning that the input power of an amplifier is adjusted such that the output power is some 6 dB below the 1 dB compression point and thus the amplifier is operates in a linear mode. Amplifier 12 receives such a low power RF level input signal that it operates in a linear mode, that is, in class A.

Thus, in the transmission-system of the present invention transmission power is adjusted in both the analog and digital modes by measuring the output transmission signal power with the directional coupler 20 and, comparing it with the desired output transmission power on lead 26 at the power level control means 24. A differential signal is used as a correction signal and is fed back to amplifiers 18 and 10.

A significant feature of the present invention is that the same structures can be used in both the analog and digital modes and that the output power in the analog mode can be adjusted by regulating the gain of gain controllable amplifier 18, or the amplifier 10 bias point or adjusting the amplifier 10 operating point, or in some implementations, the supply voltage. In the digital mode the output power can be adjusted only be regulating the gain of the gain controllable amplifier 18.

What has been described is a dual mode transmitter structure that operates in an analog or a digital mode depending on the state of a mode control signal. A linear amplifier is connected in series into the transmission signal path in the digital mode. It should be understood that the switches are logical functions and need not be implemented by physical switches. The switches 14 and/or 16 may be replaced in other implementations, for example by power divider(s).

While the invention has been described in connection with a preferred embodiment, it is not intended to limit the scope of the invention to the particular form set forth, but, on the contrary, it is intended to cover such alternatives, modifications and equivalence as may be included within the spirit and scope of the invention as defined in the appended claims.

We claim:

1. A dual mode signal transmission system wherein modulated signals are transmitted in a digital or analog mode comprising a first amplification means having controllable amplification gain responsive to a modulated signal transmission;

a mode control means responsive to a mode selection signal for selectively providing an analog mode control signal specifying a non-linear transmission mode and a digital mode control signal specifying a linear transmission mode;

said first amplification means including an amplification-adjustable, high frequency transmitter control amplifier and a non-linear high-power amplifier connected in series wherein said first amplification means is adjustable to a high power level to cause said first amplification means to operate in a non-linear mode in response to a differential control signal and wherein said first amplification means is adjustable to a low power level to cause said first amplification means to operate in a linear mode in response to a differential control signal;

a power measuring means connected to the output of said non-linear, high-power amplifier of said first amplification means for providing a signal representative of a system actual transmission power level;

means for providing a signal representative of a desired transmission power level;

power level control means connected to said analog mode control signal and said digital mode control signal of said mode control means and to the output signal of said power measuring means representative of said system actual transmission power level and to said means for providing a signal representative of a desired transmission power level for comparing said actual and desired level signals for producing a differential control signal representative of their difference; and means for connecting said differential control signal from said power level control means to said amplification-adjustable, high frequency transmitter control amplifier and to said non-linear high-power amplifier of said first amplification means for controlling the output power of said first amplification means to provide an actual transmission power level equal to said desired transmission power level;

wherein said signal from said power level control means adjusts the gain of both said high frequency transmitter control amplifier and said non-linear high power amplifier of said first amplification means to a high value to cause said first amplification means to operate in said non-linear mode in response to said analog mode control signal, and wherein the output from said power level control means adjusts the gain of only said high frequency transmitter control amplifier of said first amplification means to a low value to cause said first amplification means to operate in said linear mode in response to said digital mode control signal;

an output means including a filter and antenna means for transmitting said modulated signals;

a linear amplifier connected to said mode control means; and switch means connected to said mode control means for selectively disconnecting said non-linear high-power amplifier of said first amplification means from said power measuring means and for connecting said linear amplifier between said non-linear high-power amplifier of said first amplification means and said power measuring means in response to said digital mode control signal from said mode control means specifying said linear digital transmission mode and for disconnecting said linear amplifier from said non-linear high-power amplifier of said first amplification means and said power measuring means in response to said analog mode control signal from said mode control means specifying said non-linear analog transmission mode; and wherein said linear amplifier is connected between said non-linear high-power amplifier of said first amplification means and said power measuring means in response to said digital mode control signal specifying said linear digital transmission mode.

2. A dual mode signal transmission system according to claim 1 wherein said linear amplifier connected between said first amplification means and said power measuring means provides a linear amplified and transmitted signal from said transmission system in said linear digital transmission mode.

* * * * *